US008924900B2

(12) United States Patent
Chang et al.

(10) Patent No.: US 8,924,900 B2
(45) Date of Patent: Dec. 30, 2014

(54) ANALYTICAL SYNTHESIS METHOD AND OTRA-BASED CIRCUIT STRUCTURE

(71) Applicant: Chung Yuan Christian University, Tao-Yuan (TW)

(72) Inventors: Chun-Ming Chang, Tao-Yuan (TW); Shu-Hui Tu, Tao-Yuan (TW)

(73) Assignee: Chung Yuan Christian University, Tao-Yuan (TW)

( * ) Notice: Subject to any disclaimer, the term of this patent is extended or adjusted under 35 U.S.C. 154(b) by 0 days.

(21) Appl. No.: 13/861,218

(22) Filed: Apr. 11, 2013

(65) Prior Publication Data
US 2014/0310672 A1  Oct. 16, 2014

(51) Int. Cl.
G06F 17/50 (2006.01)

(52) U.S. Cl.
CPC .................................. *G06F 17/505* (2013.01)
USPC ....................................................... 716/104

(58) Field of Classification Search
USPC ........................................................ 716/104
See application file for complete search history.

(56) References Cited

U.S. PATENT DOCUMENTS

| 5,420,891 | A  | * | 5/1995  | Akansu ........................... 375/350 |
| 7,751,303 | B2 | * | 7/2010  | Rho et al. ........................ 370/200 |
| 8,132,143 | B2 | * | 3/2012  | Chang et al. .................... 716/132 |
| 8,264,289 | B2 | * | 9/2012  | Chang et al. ................... 331/108 B |
| 2004/0021403 | A1 | * | 2/2004 | Ayazi et al. ..................... 310/365 |
| 2006/0209988 | A1 | * | 9/2006 | Rho et al. ........................ 375/324 |
| 2010/0005430 | A1 | * | 1/2010 | Chang et al. ......................... 716/3 |
| 2010/0031205 | A1 | * | 2/2010 | Chang et al. ......................... 716/1 |
| 2010/0264996 | A1 | * | 10/2010 | Chang et al. ..................... 331/137 |

OTHER PUBLICATIONS

Gokcen, A. et al., "Fully integrated universal biquads using operational transresistance amplifiers with MOS-C realization", 2010. Department of Electrical and Electronics Engineering, Dokuz Eylul University, Tinaztepe Campus, Buca 35160 Izmir Turkey, pp. 363-372.*
Chang et al., "Generation of voltage-mode Otra-R/MOS-c LP, BP, HP, and BR biquad filter", 2011, ACM Proceeding IMCAS'11 Proceedings of the 10th WSEAS international conference on Instrumentation, measurement circuits and system, pp. 28-34.*
Ghosh, M., et al., "Third order universal filter using single operational transresistance amplifier", 2013. Hindawi Publishing Corporation, Journal of Engineering, vol. 2013, Article ID 317296, 6 pages.*
Pandey, R., et al., "Voltage mode Otra Mos-C single input multi output biquadratic unviersal filter",Theoretical and applied electrical engineering. pp. 337-344.*

* cited by examiner

*Primary Examiner* — Stacy Whitmore
(74) *Attorney, Agent, or Firm* — Donald E. Stout; Stout, Uxa & Buyan, LLP

(57) ABSTRACT

An analytical synthesis method (ASM) for designing a higher-order voltage-mode operational trans-resistance amplifier and capacitor (OTRA-C) based filter is disclosed. A decomposition of a complicated nth-order transferring a function is converted into a set of equations corresponding to a set of sub-circuitries. Then, a circuit structure is constructed by combining said sub-circuitries.

9 Claims, 17 Drawing Sheets

ANALYTICAL SYNTHESIS METHOD AND OTRA-BASED CIRCUIT STRUCTURE

BACKGROUND OF THE INVENTION

1. Field of the Invention

The present invention generally relates to filter design, and more particularly to an OTRA-based circuit.

2. Description of Related Art

An operational trans-resistance amplifier (OTRA), having the dual input-and-output characteristics of the well-known operational transconductance amplifier (OTA), becomes one of the most prospective active elements in the field of analog circuit design. The operational trans-resistance amplifier (OTRA) has the following input-and-output relationships: (i) the two + and − terminal input voltages, V+=V−=0, (ii) the output voltage, Vo=(I+−I−)Rm in which Rm is the trans-resistance of an OTRA, and I+ and I− are the two + and − terminal input currents, (iii) very low input impedance, and (iv) very low output impedance. Based upon the above two sets of input-and-output characteristics, it is apparent that an OTRA is the dual of an OTA and vice versa. In addition to this, the main advantage of eliminating the parasitics at the input port of an OTRA due to virtually grounded input terminals is an extra benefit and very attractive for designers.

Hence, several distinct OTRAs have been proposed in the literature since 1992. So do many different kinds of analog circuits, such as integrators, immittance simulators, oscillators, square/triangular waveform generators, monostable and bistable multivibrators, first-order and second-order all-pass filters, and other second-order single-function and multi-function and high-order filters. A universal biquad filter using four (two more) capacitors was presented. However, none of the elliptic Cauer filters using OTRAs has been presented. Elliptic Cauer filter is a better choice than other kinds of filters for meeting the stringent cut-off rate of a very narrow transition band, under the restriction of a finite order.

SUMMARY OF THE INVENTION

In view of the foregoing, an embodiment of the present invention provides an analytical synthesis method (ASM) for designing a better filter with fewer OTRAs and capacitors.

According to an embodiment of the present invention, a decomposition of a complicated nth-order transferring a function is converted into a set of equations corresponding to a set of sub-circuitries. Then, a circuit structure is constructed by combining said sub-circuitries. That is, an nth-order transfer function is manipulated and decomposed by a succession of innovative algebra operations until a set of simple equations are produced.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
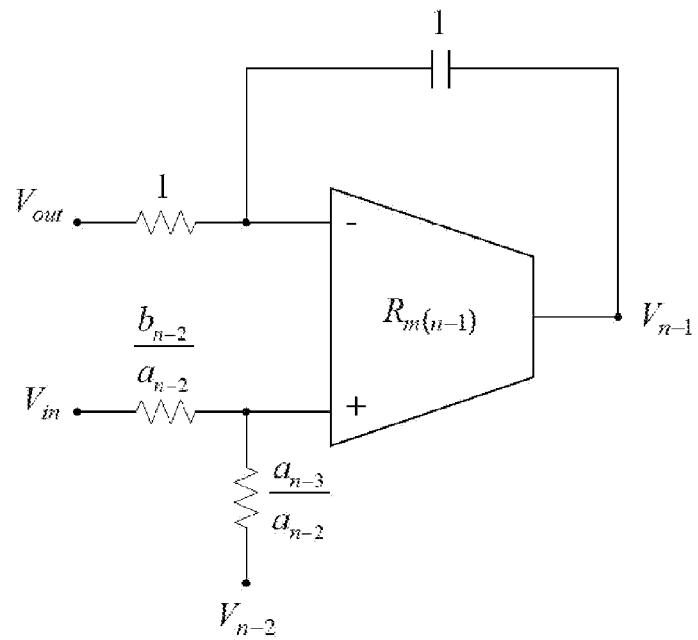
FIGS. 1A-1B show two different realizations for the kth OTRA based sub-circuitries, and k=2, 4 . . . , n−1 and n is an odd number, according to an embodiment of the invention.

Novel OTRA-C elliptic Cauer filters using new analytical synthesis methods are disclosed. A decomposition of a complicated nth-order transferring a function is converted into a set of equations corresponding to a set of sub-circuitries. Then, a circuit structure is constructed by combining said sub-circuitries. Since Rm→∞ is used as the design rule, which is not a reality, this results in a better filter with fewer OTRAs. Since more precise component values lead to worse output accuracy, better output precision may result from less accurate component values. Component sensitivity tendency and variation quantity is referred to select one or two proper capacitor(s)/resistance(s) by an appropriate variation to achieve more precise responses. The following specification applies OTRA-C elliptic Cauer filters as examples to illustrate the present invention.

New analytical synthesis methods (ASMs), shown as follows, will be presented for the realizations of the present invention. The synthesis concept is based upon the main input-and-output characteristic of an OTRA: Vo=(I+−I−)Rm. Since the trans-resistance Rm is very large, it is supposed to approach infinity, i.e., Rm→∞. Thus, I+ must equal I−. This rule is using to do the synthesis.

Embodiment 1

The transfer function of a conventional elliptic voltage-mode odd-nth-order Cauer filter which produces only low-pass signals is given by $$\frac{V_{out}}{V_{in}} = \frac{b_{n-1}s^{n-1} + b_{n-3}s^{n-3} + \ldots + b_2 s^2 + b_0}{a_n s^n + a_{n-1}s^{n-1} + a_{n-2}s^{n-2} + \ldots + a_2 s^2 + a_1 s + a_0} \quad (1)$$

where n is an odd integer. As the s in equation (1) is replaced by 1/s, the resulting is shown in equation (2) which is the transfer function of an elliptic voltage-mode odd-nth-order high-pass Cauer filter.

$$\frac{V_{out}}{V_{in}} = \frac{b_0 s^n + b_2 s^{n-2} + \ldots + b_{n-3}s^3 + b_{n-1}s}{a_0 s^n + a_1 s^{n-1} + a_2 s^{n-2} + \ldots a_{n-2}s^2 + a_{n-1}s + a_n} \quad (2)$$

Note that all the orders of the terms in the numerator of equation (1) and equation (2) are complementary each other. It is apparent that the Cauer filter realized from equation (1) cannot supply high-pass signals, secured from the one realized from equation (2). In order to be consistent with the term order, all the subscripts of the coefficients in equation (2) have been replaced and shown in equation (3).

$$\frac{V_{out}}{V_{in}} = \frac{b_n s^n + b_{n-2}s^{n-2} + \ldots + b_3 s^3 + b_1 s}{a_n s^n + a_{n-1}s^{n-1} + a_{n-2}s^{n-2} + \ldots a_2 s^2 + a_1 s + a_0} \quad (3)$$

Cross multiplying equation (3), dividing it by $a_n s^n$, and re-arranging yield $$V_{out}(1) - V_{in}\left(\frac{b_n}{a_n}\right) = V_{in}\left(\frac{b_{n-2}}{a_n s^2} + \ldots + \frac{b_3}{a_n s^{n-3}} + \frac{b_1}{a_n s^{n-1}}\right) - V_{out}\left(\frac{a_{n-1}}{a_n s} + \frac{a_{n-2}}{a_n s^2} + \ldots + \frac{a_1}{a_n s^{n-1}} + \frac{a_0}{a_n s^n}\right) \quad (4)$$

Since $\left(\frac{a_j}{a_n}\right) = \prod_{j}^{n-1}\left(\frac{a_j}{a_{j+1}}\right)$ for $j = 0, 1, \ldots, n-1$; (5)

and $$\left(\frac{b_j}{a_n}\right) = \left[\prod_{j}^{n-1}\left(\frac{a_j}{a_{j+1}}\right)\right]\left(\frac{b_j}{a_j}\right) \text{ for } j = 1, 3, \ldots, n-2 \quad (6)$$

Recombinations for some terms in equation (4) are presented as follows.

$$V_{in}\left(\frac{b_{n-2}}{a_n s^2}\right) - V_{out}\left(\frac{a_{n-1}}{a_n s} + \frac{a_{n-2}}{a_n s^2}\right) = \left(\frac{a_{n-1}}{a_n s}\right)\left[-V_{out}(1) + \left(\frac{a_{n-2}}{a_{n-1}s}\right)\left[-V_{out}(1) + V_{in}\left(\frac{b_{n-2}}{a_{n-2}}\right)\right]\right] \quad (7)$$

$$V_{in}\left(\frac{b_{n-4}}{a_n s^4}\right) - V_{out}\left(\frac{a_{n-3}}{a_n s^3} + \frac{a_{n-4}}{a_n s^4}\right) = \left(\frac{a_{n-2}}{a_n s^2}\right)\left(\frac{a_{n-3}}{a_{n-2}s}\right)\left[-V_{out}(1) + \left(\frac{a_{n-4}}{a_{n-3}s}\right)\left[-V_{out}(1) + V_{in}\left(\frac{b_{n-4}}{a_{n-4}}\right)\right]\right] \quad (8)$$

$$V_{in}\left(\frac{b_1}{a_n s^{n-1}}\right) - V_{out}\left(\frac{a_2}{a_n s^{n-2}} + \frac{a_1}{a_n s^{n-1}} + \frac{a_0}{a_n s^n}\right) = \left(\frac{a_3}{a_n s^{n-3}}\right)\left(\frac{a_2}{a_3 s}\right)\left[-V_{out}(1) + \left(\frac{a_1}{a_2 s}\right)\left[-V_{out}(1) + V_{in}\left(\frac{b_1}{a_1}\right) - V_{out}\left(\frac{a_0}{a_1 s}\right)\right]\right] \quad (9)$$

Hence, equation (4) may be decomposed and combined as the following form.

$$V_{out}(1) - V_{in}\left(\frac{b_n}{a_n}\right) = \left(\frac{a_{n-1}}{a_n s}\right)\left[-V_{out}(1) + \left(\frac{a_{n-2}}{a_{n-1}s}\right)\left[-V_{out}(1) + V_{in}\left(\frac{b_{n-2}}{a_{n-2}}\right)\right] + \left(\frac{a_{n-3}}{a_{n-2}s}\right)\left[-V_{out}(1) + \left(\frac{a_{n-4}}{a_{n-3}s}\right)\right]\left[\ldots + \ldots \left[-V_{out}(1) + V_{in}\left(\frac{b_3}{a_3}\right) + \left(\frac{a_2}{a_3 s}\right)\left[-V_{out}(1) + \left(\frac{a_1}{a_2 s}\right)\left[-V_{out}(1) + V_{in}\left(\frac{b_1}{a_1}\right) + \left(\frac{a_0}{a_1 s}\right)(-V_{out}(1))\right]\right]\right]\right] \quad (10)$$

Therefore, we may let $$V_1 = \frac{1}{s}(-V_{out}(1)) \quad (11)$$

$$V_2 = \frac{1}{s}\left(-V_{out}(1) + V_{in}\left(\frac{b_1}{a_1}\right) + V_1\left(\frac{a_0}{a_1}\right)\right) \quad (12)$$

$$V_3 = \frac{1}{s}\left(-V_{out}(1) + V_2\left(\frac{a_1}{a_2}\right)\right) \quad (13)$$

$$\ldots$$

$$V_{n-1} = \frac{1}{s}\left(-V_{out}(1) + V_{in}\left(\frac{b_{n-2}}{a_{n-2}}\right) + V_{n-2}\left(\frac{a_{n-3}}{a_{n-2}}\right)\right) \quad (14)$$

$$V_{n-1} = \frac{1}{s}\left(-V_{out}(1) + V_{n-1}\left(\frac{a_{n-2}}{a_{n-1}}\right)\right) \quad (15)$$

$$V_{out}(1) - V_{in}\left(\frac{b_n}{a_n}\right) = V_n\left(\frac{a_{n-1}}{a_n}\right) \quad (16)$$

Therefore, the transfer function (1) has been decomposed, using a series of algebraic manipulations, into the above simple equations, from equation (11) to equation (15). Observing equation (11) to equation (15), the configuration of equation (15) includes the others. Hence, we present the typical two OTRA-C based sub-circuitries realized from equation (14) and equation (16), both of which are shown in FIGS. 1A-1B and FIGS. 2A-2B, respectively.

Figure 1B:
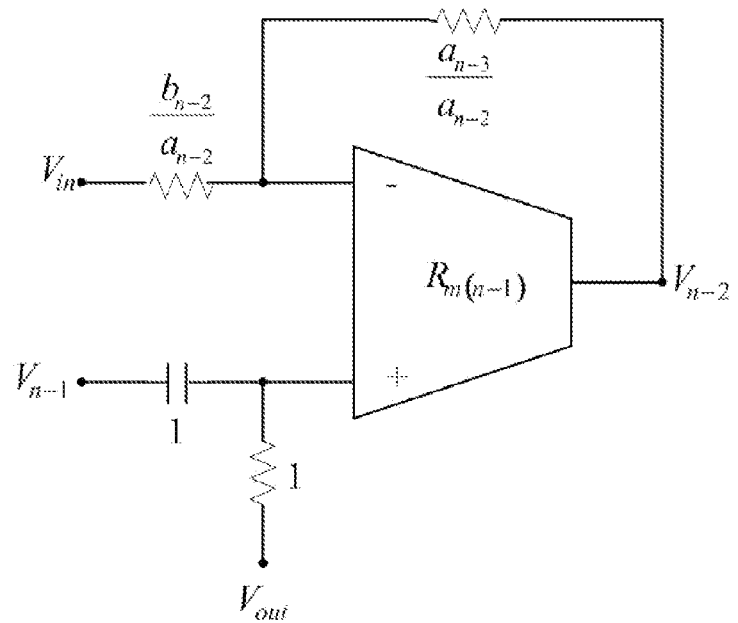
Figure 2A:
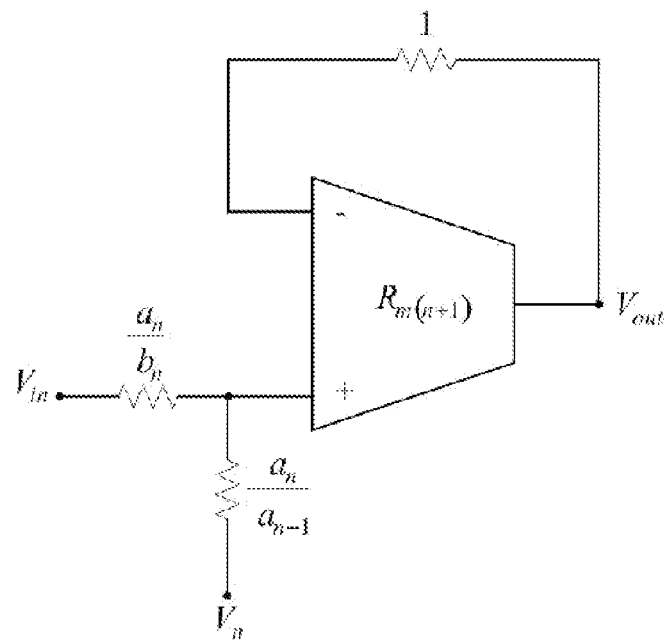
FIGS. 2A-2B show two different realizations for the n+1th OTRA based sub-circuitries according to an embodiment of the invention.
Figure 2B:
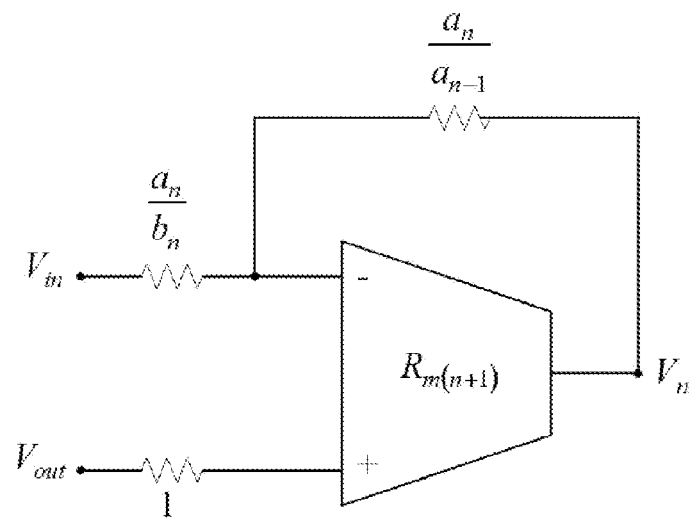

Referring to FIGS. 1A-1B, which show the kth OTRA based sub-circuitries respectively, and k=2, 4, . . . , n−1 and n is an odd number, the main difference between the kth OTRA based sub-circuitries in FIGS. 1A-1B is the position of the capacitor arranged out of or in a feedback loop. Referring to FIGS. 2A-2B, FIGS. 2A-2B show two different realizations for the n+1th OTRA based sub-circuitry.

Figure 3A:
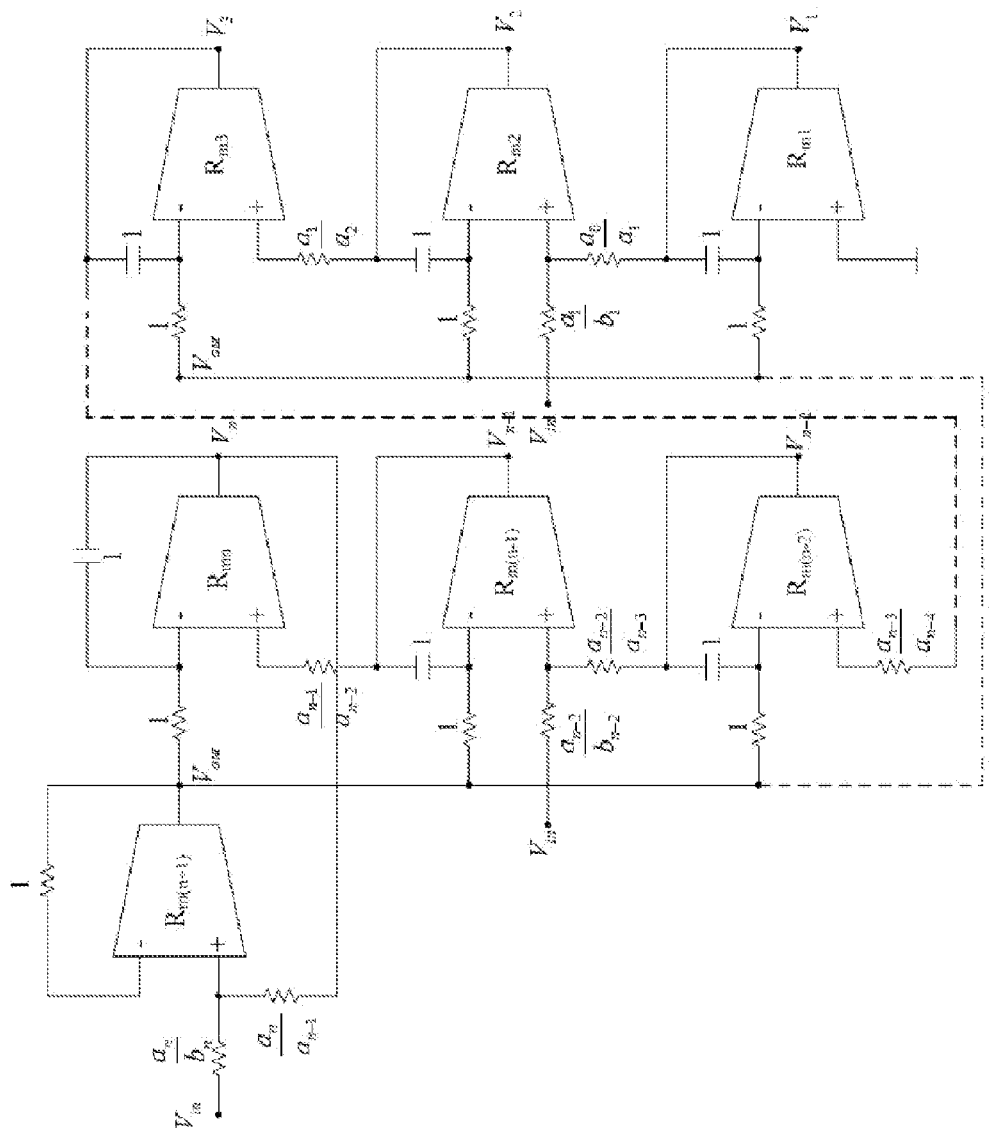
FIGS. 3A-3B show two different Elliptic OTRA-C based odd-nth-order high-pass Cauer Filter structures according to the embodiment of the invention.
Figure 3B:
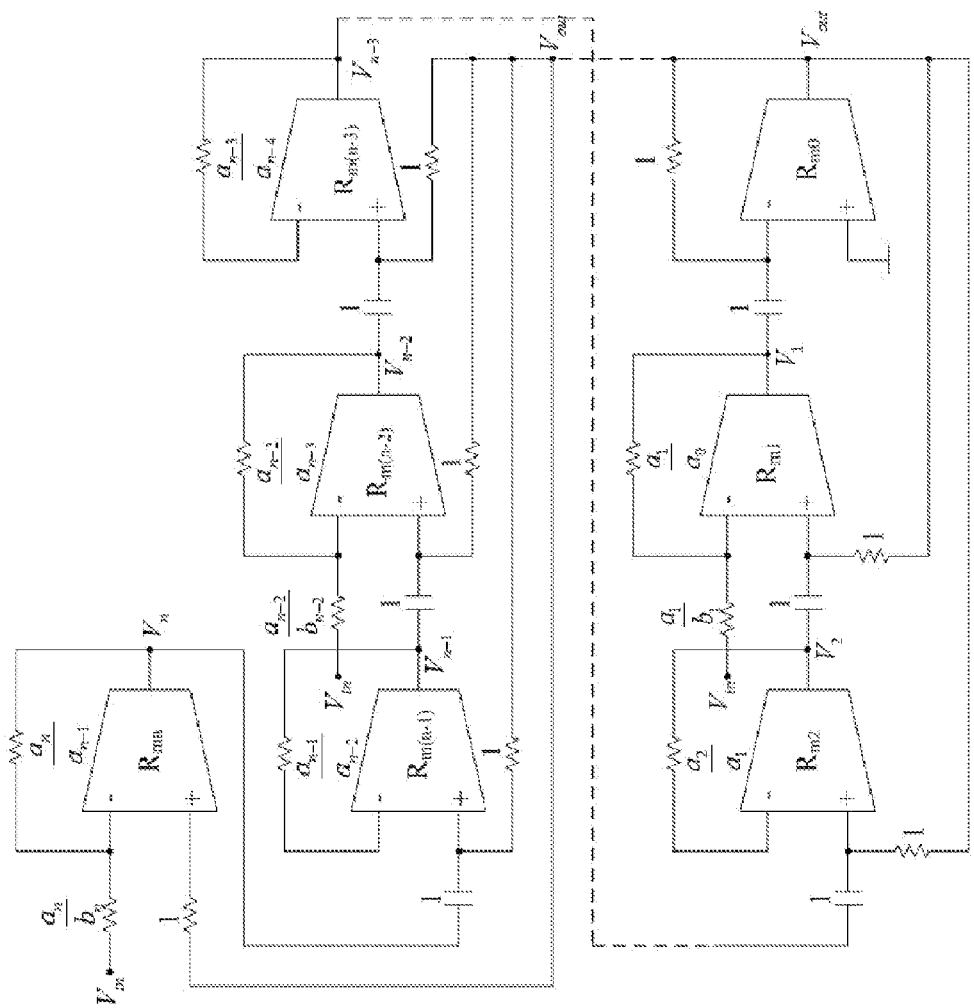

Referring to FIG. 3A and FIG. 3B, the combinations of all the n sub-circuitries realized from equations (11) to (16) are respectively shown in FIG. 3A and FIG. 3B, which are elliptic OTRA-C based voltage-mode odd-nth-order high-pass Cauer filter. Therefore, according to the analytical synthesis method mentioned above, the elliptic OTRA-C based voltage-mode odd-nth-order high-pass Cauer filter can be realized by the use of n+1 OTRAs and n capacitors.

To illustrate the synthesis method, consider the structure generation of a third order filter. The synthesis method uses equations (11), (14), (15) and (16). Based on these equations, when n=3, the following equations may be obtained:

$$V_1 = \frac{1}{s}(-V_{out}(1)) \quad (17)$$

-continued $$V_2 = \frac{1}{s}\left(-V_{out}(1) + V_{in}\left(\frac{b_1}{a_1}\right) + V_1\left(\frac{a_0}{a_1}\right)\right) \quad (18)$$

$$V_3 = \frac{1}{s}\left(-V_{out}(1) + V_2\left(\frac{a_1}{a_2}\right)\right) \quad (19)$$

$$V_{out}(1) - V_{in}\left(\frac{b_3}{a_3}\right) = V_3\left(\frac{a_2}{a_3}\right) \quad (20)$$

Figure 4A:
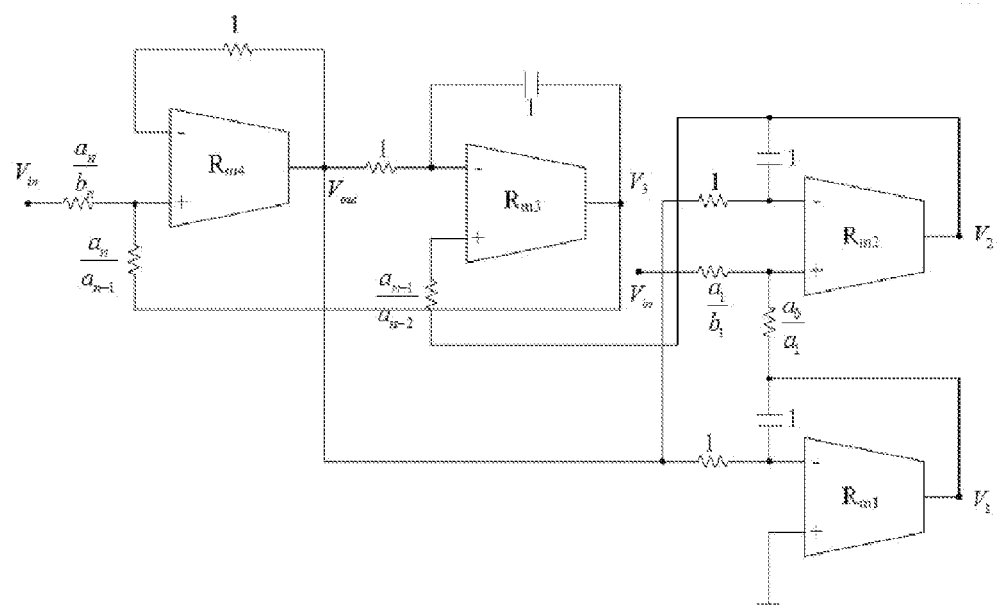
FIGS. 4A-4B show two different realizations for the elliptic OTRA-C based third-order high-pass Cauer filter according to the embodiment of the invention.
Figure 4B:
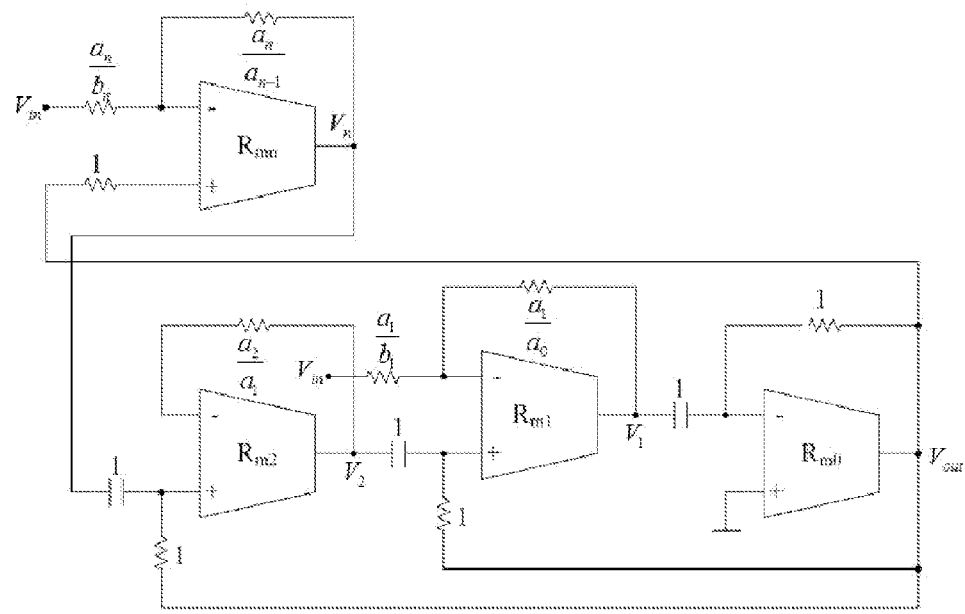

Therefore, the combination of the four OTRA-C based sub-circuitries realized from equations (17) to (20) are respectively shown in FIG. 4A and FIG. 4B, which are elliptic OTRA-based third-order high-pass Cauer filter.

Embodiment 2

Different from the above analytical synthesis, another approach for analytically synthesizing the transfer function (3) is shown as follows.

Cross multiplying the transfer function (3) and dividing it by $s^{n-1}$ yield $$V_{out}\left[(a_n s + a_{n-1}) + \frac{a_{n-2}}{s} + \ldots + \frac{a_3}{s^{n-4}} + \frac{a_2}{s^{n-3}} + \left(\frac{a_1}{s^{n-2}} + \frac{a_0}{s^{n-1}}\right)\right] = \quad (21)$$
$$V_{in}\left[(a_n s) + \frac{b_{n-2}}{s} + \ldots + \frac{b_3}{s^{n-4}} + \left(\frac{b_1}{s^{n-2}}\right)\right]$$

Combine the last two terms of the left side and the last term of the right side of equation (21) as $$V_{in}\left(\frac{b_1}{s^{n-2}}\right) - V_{out}\left(\frac{a_1}{s^{n-2}} + \frac{a_0}{s^{n-1}}\right) = \left(\frac{1}{s^{n-2}}\right)\left[V_{in}(b_1) - V_{out}\left(a_1 + \frac{a_0}{s}\right)\right] \quad (22)$$

Add the last third term of the left side of equations (21) to (22) and arrange them as $$\left(\frac{1}{s^{n-2}}\right)\left[V_{in}(b_1) - V_{out}\left(a_1 + \frac{a_0}{s}\right)\right] - V_{out}\left(\frac{a_2}{s^{n-3}}\right) = \quad (23)$$
$$\left(\frac{1}{s^{n-3}}\right)\left[\left(\frac{1}{s}\right)\left[V_{in}(b_1) - V_{out}\left(a_1 + \frac{a_0}{s}\right)\right] - V_{out}(a_2)\right]$$

Add the last fourth terms of the left side and the last second term of the right side of equations (21) to (23) and re-arrange them as $$\left(\frac{1}{s^{n-3}}\right)\left[\left(\frac{1}{s}\right)\left[V_{in}(b_1) - V_{out}\left(a_1 + \frac{a_0}{s}\right)\right] - V_{out}(a_2)\right] + \quad (24)$$
$$V_{in}\left(\frac{b_3}{s^{n-4}}\right) - V_{out}\left(\frac{a_3}{s^{n-4}}\right) =$$
$$\left(\frac{1}{s^{n-4}}\right)\left[\left(\frac{1}{s}\right)\left(\frac{1}{s}\right)\left[V_{in}(b_1) - V_{out}\left(a_1 + \frac{a_0}{s}\right)\right] - V_{out}(a_2)\right] +$$
$$V_{in}(b_3) - V_{out}(a_3)\right]$$

Continue the above combinations and arrangements for the other terms of equation (21) and then equation (21) may be decomposed as $$V_{out}(a_n s + a_{n-1}) = V_{in}(a_n s) = \quad (25)$$
$$\left(\frac{1}{s}\right)\left[\left(\frac{1}{s}\right)\left(\frac{1}{s}\right)\left(\frac{1}{s}\right)\left[\ldots\left[\left(\frac{1}{s}\right)\left(\frac{1}{s}\right)\left[V_{in}(b_1) - V_{out}\left(a_1 + \frac{a_0}{s}\right)\right] - V_{out}(a_2)\right] + V_{in}(b_3) - V_{out}(a_3)\right] + \ldots\right] +$$
$$V_{in}(b_{n-4}) - V_{out}(a_{n-4})\right] - V_{out}(a_{n-3})\right] +$$
$$V_{in}(b_{n-2}) - V_{out}(a_{n-2})\right]$$

Therefore, we may let $$V_1 = -\left(\frac{a_0}{s}\right)V_{out}, \text{ i.e., } V_1\left(\frac{s}{a_0}\right) = -V_{out}(1) \quad (26)$$

$$V_2\left(\frac{s}{a_1}\right) = V_{in}\left(\frac{b_1}{a_1}\right) - V_{out}(1) + V_1\left(\frac{1}{a_1}\right) \quad (27)$$

$$V_3\left(\frac{s}{a_2}\right) = -V_{out}(1) + V_2\left(\frac{1}{a_2}\right) \quad (28)$$

$$V_4\left(\frac{s}{a_3}\right) = V_{in}\left(\frac{b_3}{a_3}\right) - V_{out}(1) + V_3\left(\frac{1}{a_3}\right) \quad (29)$$

$$\ldots$$

$$V_{n-2}\left(\frac{s}{a_{n-3}}\right) = -V_{out}(1) + V_{n-3}\left(\frac{1}{a_{n-3}}\right) \quad (30)$$

$$V_{n-1}\left(\frac{s}{a_{n-2}}\right) = V_{in}\left(\frac{b_{n-2}}{a_{n-2}}\right) - V_{out}(1) + V_{n-2}\left(\frac{1}{a_{n-2}}\right) \quad (31)$$

And $V_{out}(a_n s + a_{n-1}) = V_{in}(a_n s) + V_{n-1}(1)$, i.e., $$V_{out}\left(\frac{a_n s}{a_{n-1}} + 1\right) = V_{in}\left(\frac{a_n s}{a_{n-1}}\right) + V_{n-1}\left(\frac{1}{a_{n-1}}\right) \quad (32)$$

Observing equations (26) to (31), all the simple equations from equations (26) to (31) may be represented by a typical equation (31). The OTRA-C based sub-circuitries realized from equations (31) and (32) are shown in FIGS. 5A-5B and FIGS. 6A-6B, respectively.

Figure 5A:
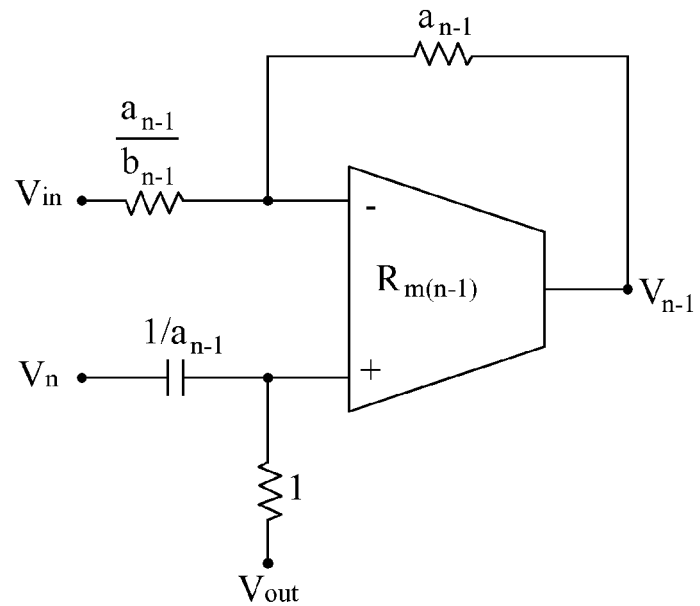
FIGS. 5A-5B show two different realizations for the kth OTRA based sub-circuitries, and k=2, 4, . . . , n−1 and n is an odd number, according to another embodiment of the invention.
Figure 5B:
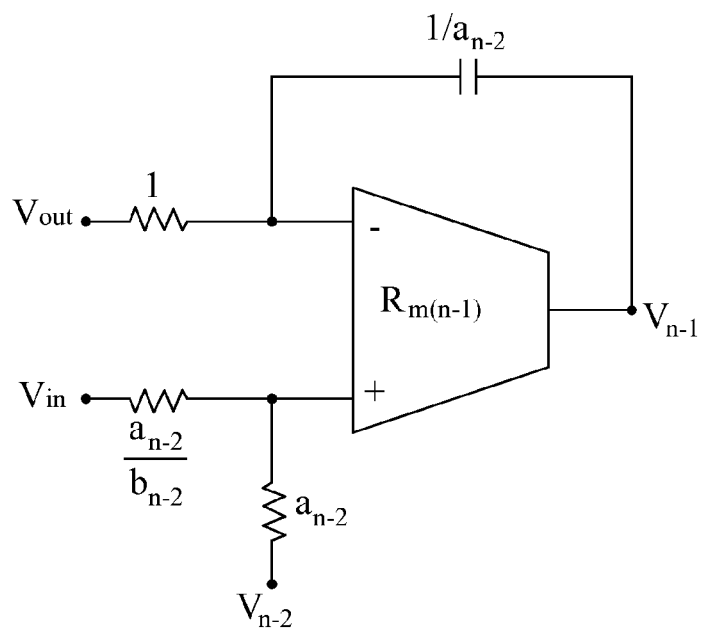
Figure 6A:
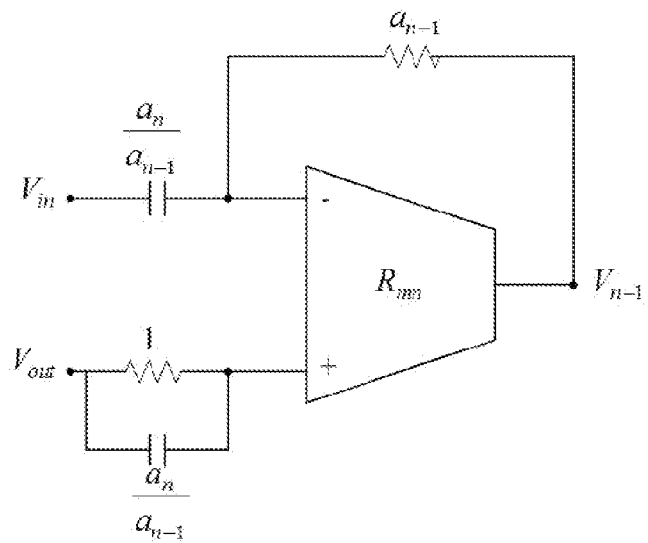
FIGS. 6A-6B show two different realizations for the nth OTRA based sub-circuitries according to another embodiment of the invention.
Figure 6B:
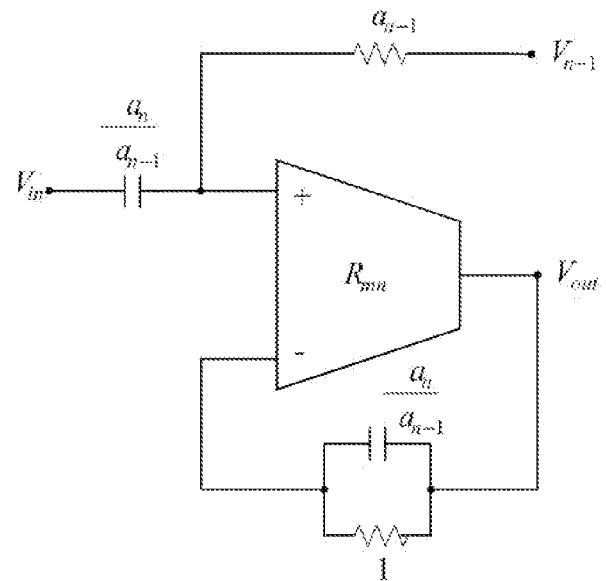

Referring to FIGS. 5A-5B, which show the kth OTRA based sub-circuitries respectively and k=2, 4, . . . , n−1, the main difference between the kth OTRA based sub-circuitries in FIGS. 5A-5B is the position of the capacitor arranged out of or in a feedback loop. As for FIGS. 6A-6B, FIGS. 6A-6B respectively illustrate two different realizations for the nth OTRA based sub-circuitry.

Figure 7A:
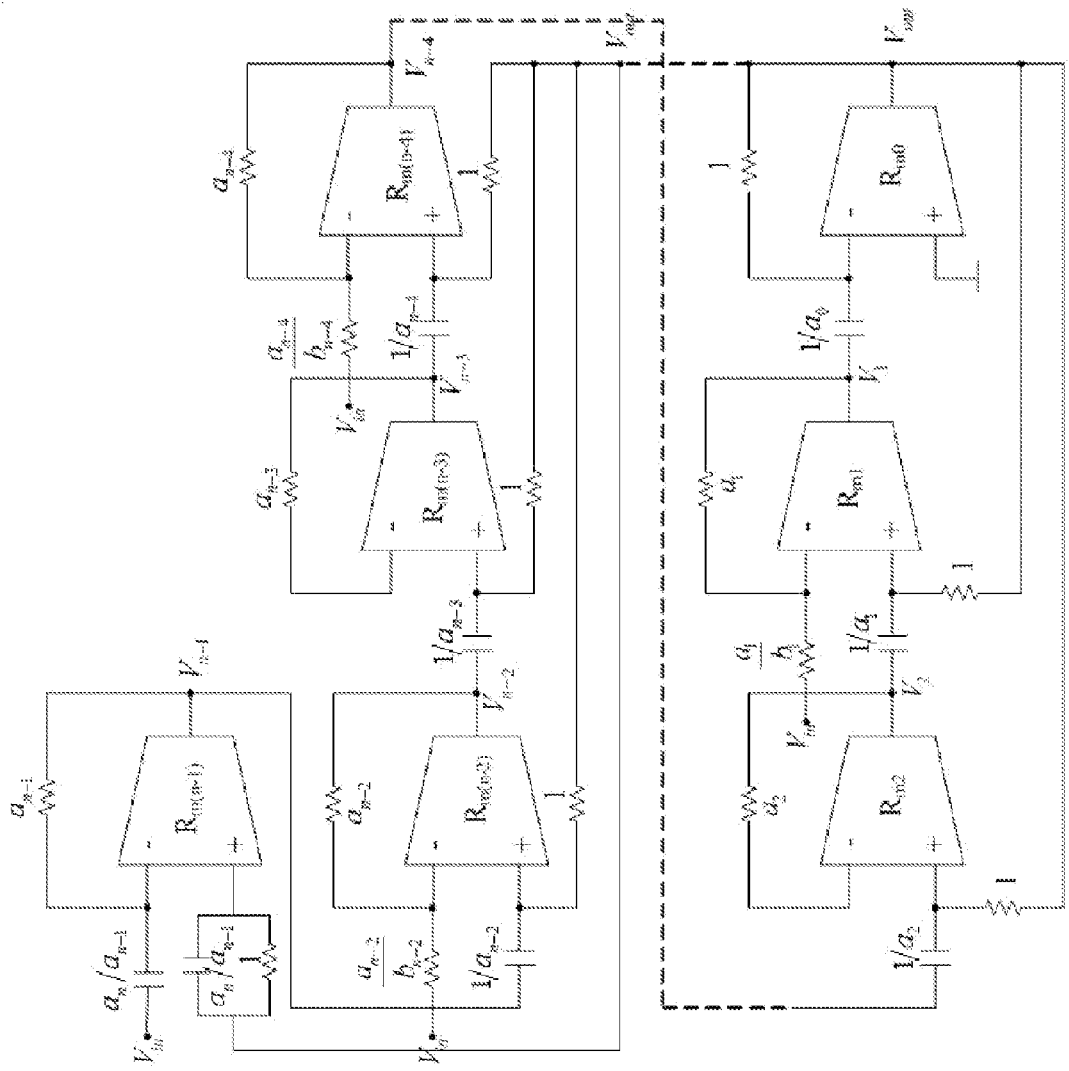
FIGS. 7A-7B show two Elliptic OTRA-C based odd-nth-order high-pass Cauer Filter structures according to another embodiment of the invention.
Figure 7B:
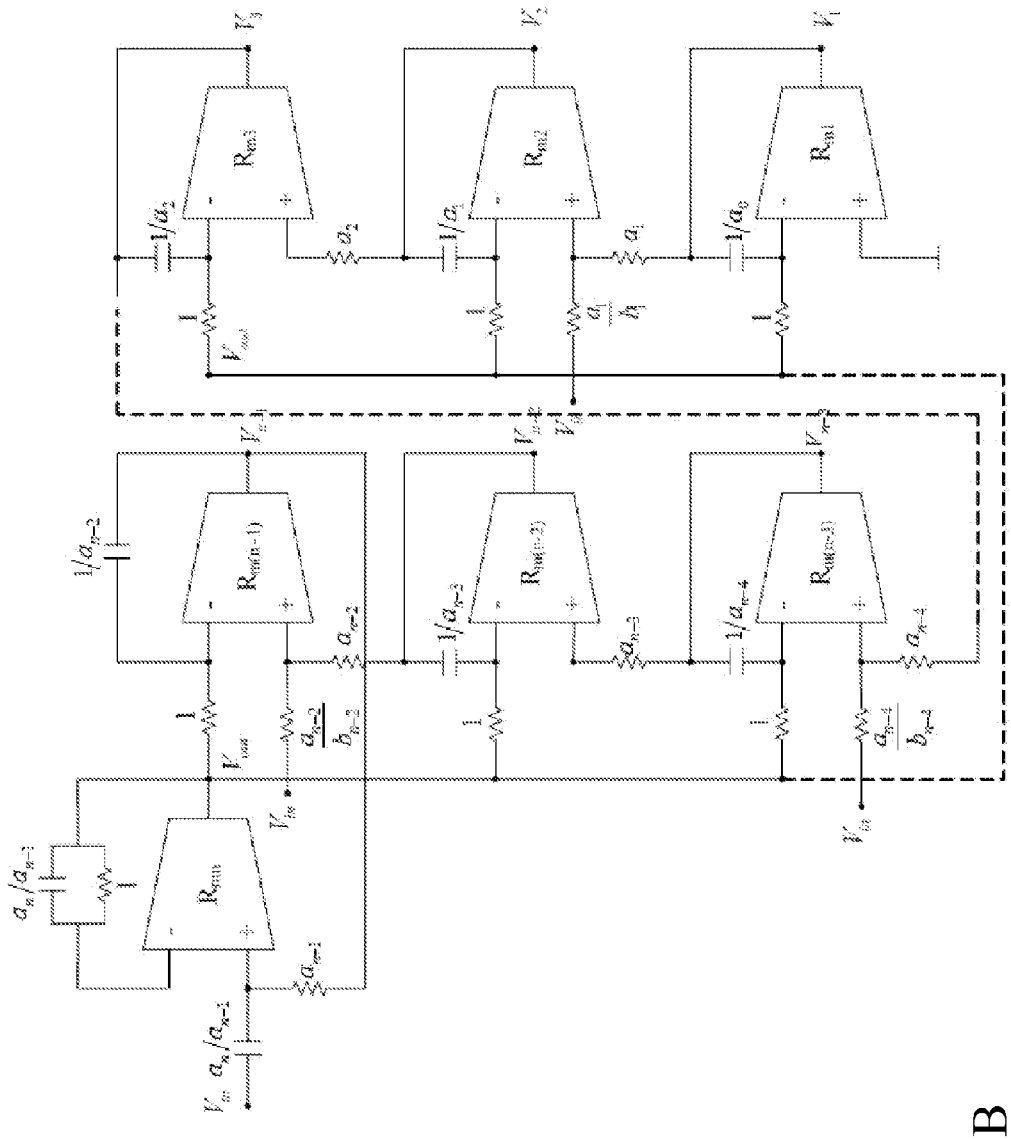

Based upon these two typical realized sub-circuitries, all of the simple equations are easily realizable. The superposition of all the realized OTRA-C based sub-circuitries constructs the second elliptic OTRA-C based voltage-mode odd-nth-order high-pass Cauer filter structures which are respectively shown in FIGS. 7A-7B. Therefore, according to the analytical synthesis method mentioned above, the elliptic OTRA-C based voltage-mode odd-nth-order high-pass Cauer filter can be realized by the use of n OTRAs and n+1 capacitors.

To illustrate the synthesis method, consider the structure generation of a third order filter. The synthesis method uses equations (26), (31), and (32). Based on these equations, when n=3, the following equations may be obtained:

$$V_1\left(\frac{s}{a_0}\right) = V_{out}(1) \quad (33)$$

$$V_2\left(\frac{s}{a_1}\right) = V_{in}\left(\frac{b_1}{a_1}\right) - V_{out}(1) + V_1\left(\frac{1}{a_1}\right) \quad (34)$$

$$V_{out}\left(\frac{a_3 s}{a_2} + 1\right) = V_{in}\left(\frac{a_3 s}{a_2}\right) + V_2\left(\frac{1}{a_2}\right) \quad (35)$$

Figure 8A:
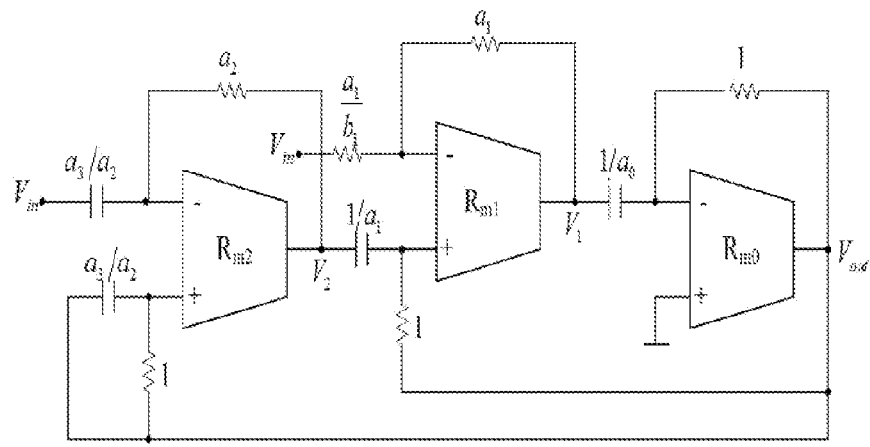
FIGS. 8A-8B show two Elliptic OTRA-C based third-order high-pass Cauer filters.
Figure 8B:
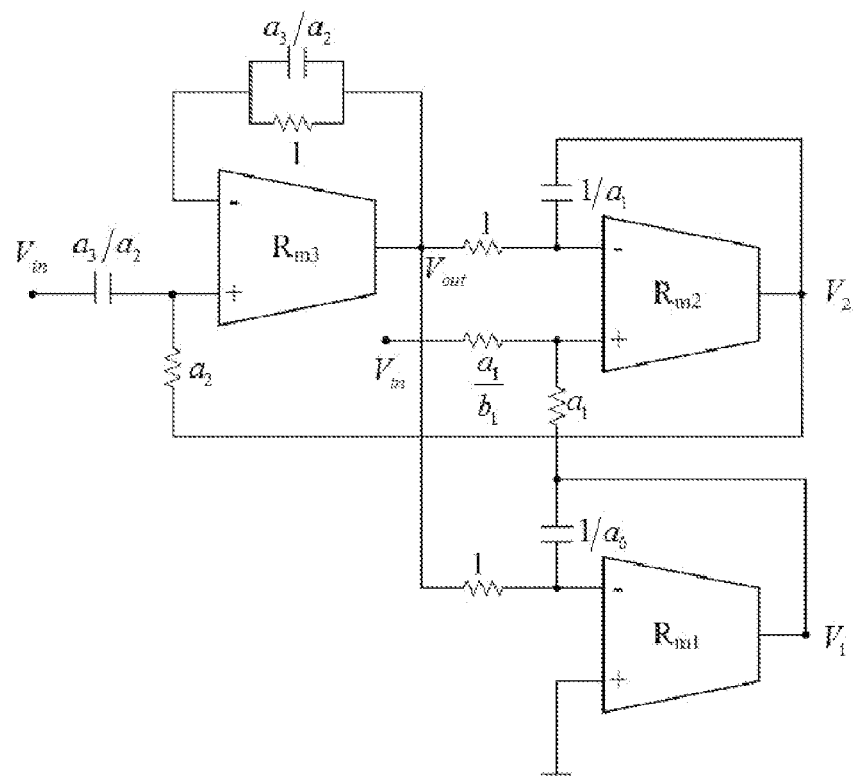

Consequently, the combination of the three OTRA-C based sub-circuitries realized from the above three equations is an elliptic third-order OTRA-C based high-pass Cauer filter which may be realized as shown in FIGS. 8A-8B.

Embodiment 3

Consider again the elliptic odd-nth-order Cauer filter given by (1). Cross-multiplying (1), then dividing both sides of the resulting equation by $a_n s^{n-1}$, we can show that $$\left(s + \frac{a_{n-1}}{a_n} + \frac{a_{n-2}}{a_n s} + \ldots + \frac{a_2}{a_n s^{n-3}} + \frac{a_1}{a_n s^{n-2}} + \frac{a_0}{a_n s^{n-1}}\right) V_{out} = \left(\frac{b_{n-1}}{a_n} + \frac{b_{n-2}}{a_n s^2} + \ldots + \frac{b_2}{a_n s^{n-3}} + \frac{b_0}{a_n s^{n-1}}\right) V_{in} \quad (36)$$

By re-arranging, we may write (36) as $$\left(s + \frac{a_{n-1}}{a_n}\right) V_{out} - \left(\frac{b_{n-1}}{a_n}\right) V_{in} = \quad (37)$$
$$\frac{1}{s}\left(-\frac{a_{n-2}}{a_n}\right) V_{out} + \frac{1}{s^2}\left(\frac{b_{n-3}}{a_n} V_{in} - \frac{a_{n-3}}{a_n} V_{out}\right) +$$
$$\frac{1}{s^3}\left(-\frac{a_{n-4}}{a_n}\right) V_{out} + \frac{1}{s^4}\left(\frac{b_{n-5}}{a_n} V_{in} - \frac{a_{n-5}}{a_n} V_{out}\right) + \ldots +$$
$$\ldots + \frac{1}{s^{n-2}}\left(-\frac{a_1}{a_n}\right) V_{out} + \frac{1}{s^{n-1}}\left(\frac{b_0}{a_n} V_{in} - \frac{a_0}{a_n} V_{out}\right)$$

This may be re-written as $$\left(s + \frac{a_{n-1}}{a_n}\right) V_{out} - \left(\frac{b_{n-1}}{a_n}\right) V_{in} = \quad (38)$$
$$\left(\frac{1}{s}\right)\left(-\frac{a_{n-2}}{a_n} V_{out} + \left(\frac{1}{s}\right)\left(\frac{b_{n-3}}{a_n} V_{in} - \frac{a_{n-3}}{a_n} V_{out} + \left(\frac{1}{s}\right)\left(-\frac{a_{n-4}}{a_n} V_{out} + \right.\right.\right.$$
$$\left.\left.\left.\ldots + \left(\frac{1}{s}\right)\left(-\frac{a_1}{a_n} V_{out} + \left(\frac{1}{s}\right)\left(\frac{b_0}{a_n} V_{in} - \frac{a_0}{a_n} V_{out}\right)\right)\ldots\right)\right)\right)$$

Based on the above, we may write the following relations.

$$V_0 = \left(\frac{1}{s}\right)\left(\frac{b_0}{a_n} V_{in} - \frac{a_0}{a_n} V_{out}\right) \quad (39.0)$$

$$V_j = \left(\frac{1}{s}\right)\left(V_{j-1} - \frac{a_j}{a_n} V_{out}\right) \text{ for } j = 1, 3, 5, \ldots, n\text{-}2. \quad (39.j)$$

$$V_k = \left(\frac{1}{s}\right)\left(V_{k-1} + \frac{b_k}{a_n} V_{in} - \frac{a_k}{a_n} V_{out}\right) \text{ for } k = 2, 4, 6, \ldots, n\text{-}3 \quad (39.k)$$

and $$\left(s + \frac{a_{n-1}}{a_n}\right) V_{out} - \left(\frac{b_{n-1}}{a_n}\right) V_{in} = V_{n-2} \quad (39.n\text{-}1)$$

Figure 9:
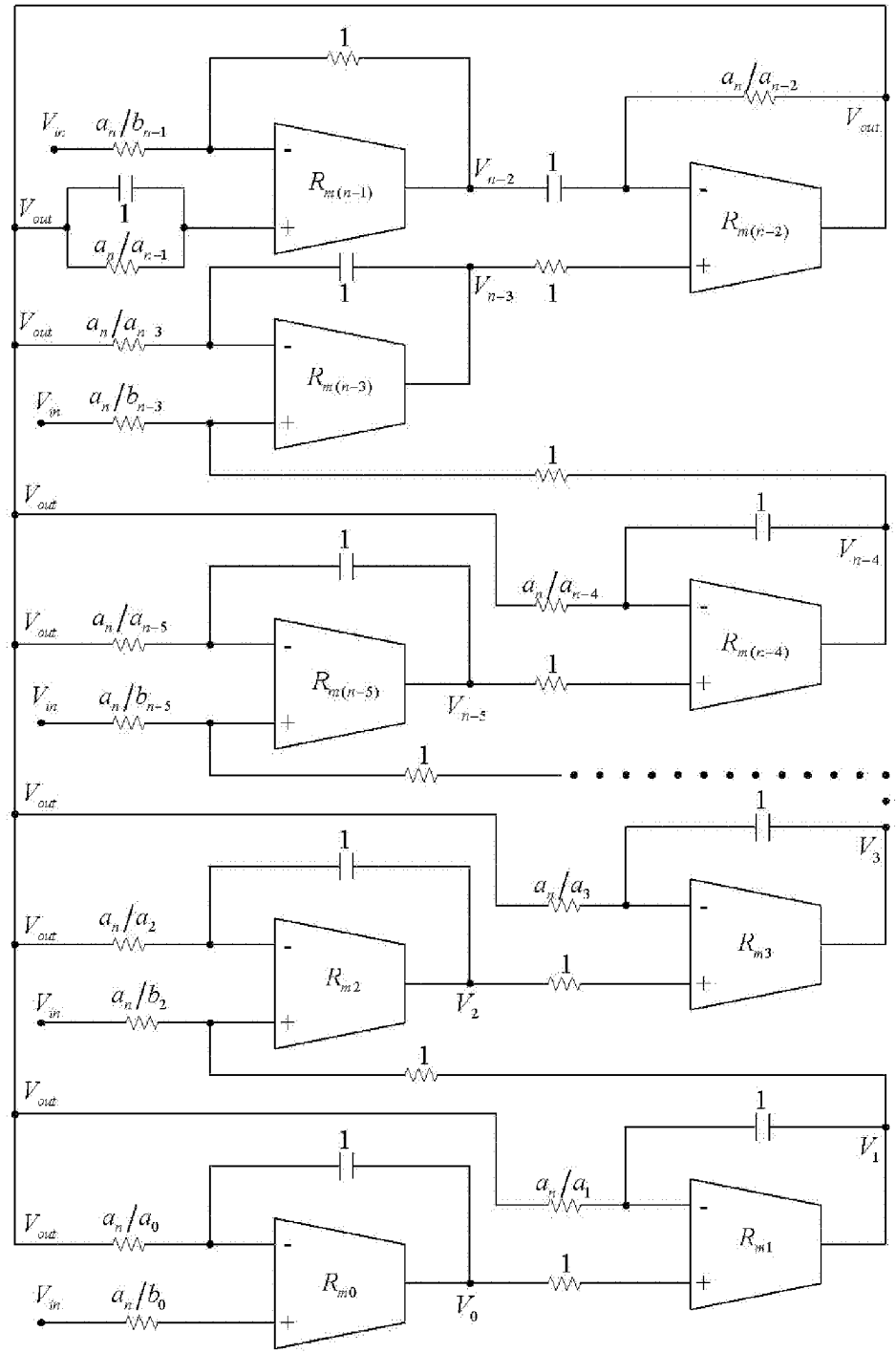
FIG. 9 shows an Elliptic OTRA-C based odd-nth-order Cauer Filter structure according to one embodiment of the invention.

Therefore, the transfer function (1) has been decomposed, using a series of algebraic manipulations, into the above n simple equations, from (39.0) to (39.n−1), each of which is easily realizable by a single OTRA, a capacitor, and several resistors. The combination of all the n sub-circuitries obtained from (39.0) to (39.n−1) is shown in FIG. 9, which is another OTRA-RC structure realizing the odd-nth-order elliptic Cauer filter structure given by (1). There are n OTRAs, n capacitors, and (5n−1)/2 resistors employed in the realization.

Let us consider the particular case when n=3; based upon the relations (39), we obtain the following three simple equations.

$$V_0 = \left(\frac{1}{s}\right)\left(\frac{b_0}{a_3} V_{in} - \frac{a_0}{a_3} V_{out}\right) \quad (40.0)$$

$$V_1 = \left(\frac{1}{s}\right)\left(V_0 - \frac{a_1}{a_3} V_{out}\right) \quad (40.1)$$

and $$\left(s + \frac{a_2}{a_3}\right) V_{out} - \left(\frac{b_2}{a_3}\right) V_{in} = V_1 \quad (40.2)$$

Figure 10:
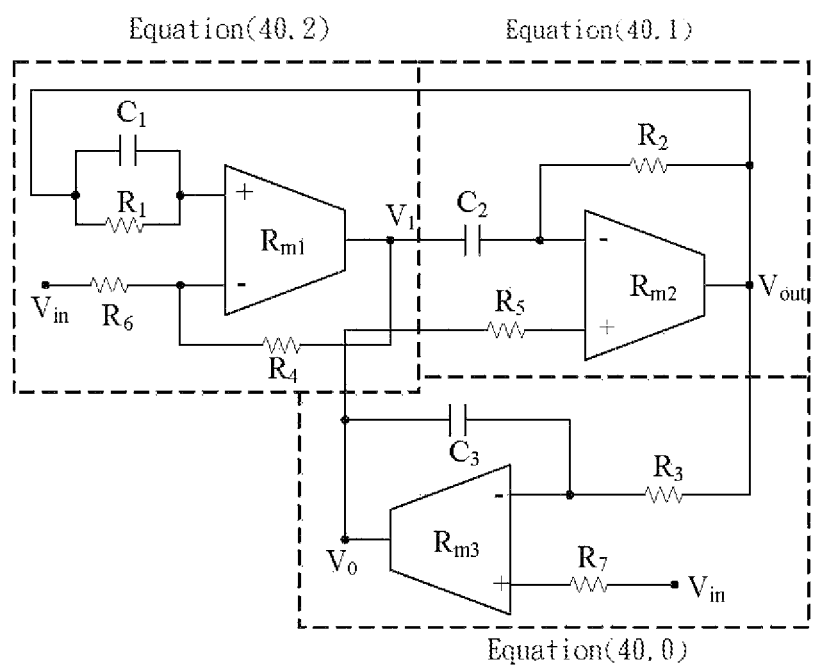
FIG. 10 shows a realization for the elliptic OTRA-C based third-order Cauer filter according to the embodiment of the invention.

Superposing these three sub-circuitries realized from (40.0), (40.1), and (402), a third-order elliptic Cauer filter is obtained, as shown in FIG. 10. The dashed blocks in FIG. 10 show the three corresponding sub-circuitries realized from (40.0), (40.1), and (40.2), where the component values are given by C1=C2=C3=1 F, G1=a2/a3 ℧, G2=a1/a3 ℧, G3=a0/a3 ℧, G4=1 ℧, G5=1 ℧, G6=b2/a3 ℧, and G7=b0/a3 ℧. Note that the synthesized elliptic Cauer filter structure uses equal capacitors, thus avoiding the difficulty of realizing precise values of different capacitors in an integrated circuit.

Then, in the following embodiments, two analytical synthesis methods (ASMs) will be presented for the realization of two even-nth-order elliptic Cauer filters, which have the following main difference: one uses "n+1" OTRAs and "n" capacitors and the other employs "n" OTRAs and "n+1" capacitors.

Embodiment 4

The transfer function of a conventional elliptic voltage-mode even-nth-order Cauer filter which produces only low-pass signals is given by $$\frac{V_{out}}{V_{in}} = \frac{b_n s^n + b_{n-2} s^{n-2} + \ldots + b_2 s^2 + b_0}{a_n s^n + a_{n-1} s^{n-1} + a_{n-2} s^{n-2} + \ldots + a_2 s^2 + a_1 s + a_0} \quad (41)$$

Cross multiplying (41), then dividing both sides by $a_n s^{n-1}$ and rearranging the terms just as we did in the above embodiment, we obtain $$\left(s + \frac{a_{n-1}}{a_n}\right) V_{out} - \left(\frac{b_n}{a_n} s\right) V_{in} = \quad (42)$$
$$\frac{1}{s}\left(\frac{b_{n-2}}{a_n} V_{in} - \frac{a_{n-2}}{a_n} V_{out}\right) + \frac{1}{s^2}\left(-\frac{a_{n-3}}{a_n}\right) V_{out} +$$
$$\frac{1}{s^3}\left(\frac{b_{n-4}}{a_n} V_{in} - \frac{a_{n-4}}{a_n} V_{out}\right) + \frac{1}{s^4}\left(-\frac{a_{n-5}}{a_n}\right) V_{out} + \ldots +$$

-continued $$\frac{1}{s^{n-2}}\left(-\frac{a_1}{a_n}\right)V_{out} + \frac{1}{s^{n-1}}\left(\frac{b_0}{a_n}V_{in} - \frac{a_0}{a_n}V_{out}\right)$$

Equation (42) may be re-written as $$\left(s + \frac{a_{n-1}}{a_n}\right)V_{out} - \left(\frac{b_n}{a_n}s\right)V_{in} = \left(\frac{1}{s}\right)\left(\frac{b_{n-2}}{a_n}V_{in} - \frac{a_{n-2}}{a_n}V_{out} + \left(\frac{1}{s}\right)\left(-\frac{a_{n-3}}{a_n}V_{out} + \left(\frac{1}{s}\right)\left(\frac{b_{n-4}}{a_n}V_{in} - \frac{a_{n-4}}{a_n}V_{out} + \ldots + \left(\frac{1}{s}\right)\left(-\frac{a_1}{a_n}V_{out} + \left(\frac{1}{s}\right)\left(\frac{b_0}{a_n}V_{in} - \frac{a_0}{a_n}V_{out}\right)\right)\ldots\right)\right)\right) \quad (43)$$

Based on the above equation, we may write the following relations.

$$V_0 = \left(\frac{1}{s}\right)\left(\frac{b_0}{a_n}V_{in} - \frac{a_0}{a_n}V_{out}\right) \quad (44.0)$$

$$V_j = \left(\frac{1}{s}\right)\left(V_{j-1} - \frac{a_j}{a_n}V_{out}\right) \quad \text{for } j = 1, 3, 5, \ldots, n-3. \quad (44.j)$$

$$V_k = \left(\frac{1}{s}\right)\left(V_{k-1} + \frac{b_k}{a_n}V_{in} - \frac{a_k}{a_n}V_{out}\right) \quad \text{for } k = 2, 4, 6, \ldots, n-2 \quad (44.k)$$

and $$\left(s + \frac{a_{n-1}}{a_n}\right)V_{out} - \left(\frac{b_{n-1}}{a_n}s\right)V_{in} = V_{n-2} \quad (44.n-1)$$

Figure 11:
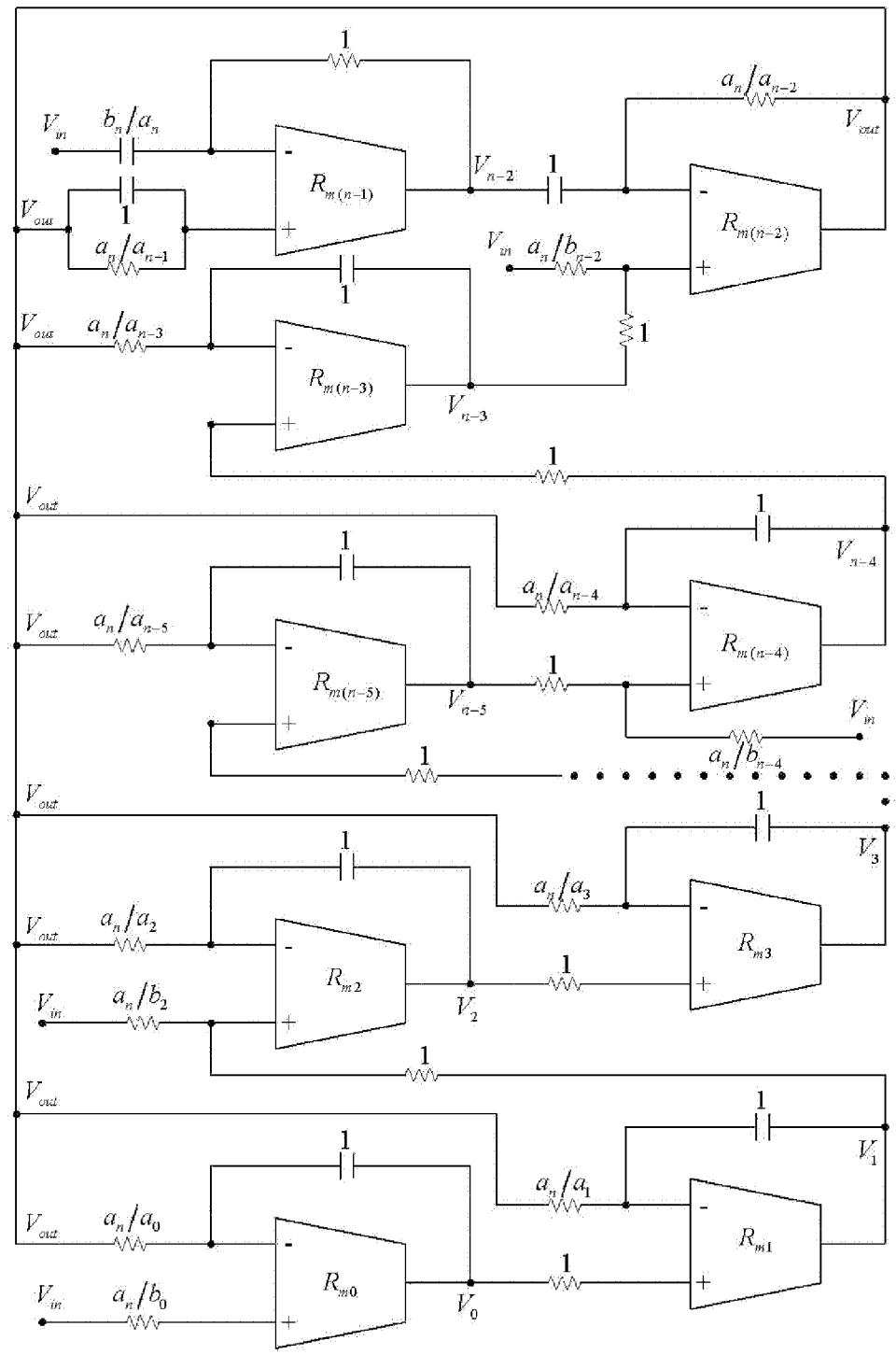
FIG. 11 shows an Elliptic OTRA-C based even-nth-order Cauer Filter structure according to one embodiment of the invention.

Therefore, the transfer function (41) has been decomposed, using a series of algebraic manipulations, into the above n simple equations, from (44.0) to (44.n−1). Each of the above n equations can be realized using a single OTRA, one capacitor and several resistors, except for (44.n−1) for which two capacitors are required. The combination of all the n sub-circuitries realized from (44.0) to (44.n−1) is shown in FIG. 11, which is an OTRA-RC structure realizing the even-nth-order elliptic Cauer filter given by (41). There are n OTRAs, n+1 capacitors, and (5n−2)/2 resistors employed in the realization.

Let us consider the case when n=4; based upon the relations (44), we obtain the following three simple relations.

$$V_0 = \left(\frac{1}{s}\right)\left(\frac{b_0}{a_4}V_{in} - \frac{a_0}{a_4}V_{out}\right) \quad (45.0)$$

$$V_1 = \left(\frac{1}{s}\right)\left(V_0 - \frac{a_1}{a_4}V_{out}\right) \quad (45.1)$$

$$V_2 = \left(\frac{1}{s}\right)\left(V_1 + \frac{b_2}{a_4}V_{in} - \frac{a_2}{a_4}V_{out}\right) \quad (45.2)$$

and $$\left(s + \frac{a_3}{a_4}\right)V_{out} - \left(\frac{b_4}{a_4}s\right)V_{in} = V_2 \quad (45.3)$$

Figure 12:
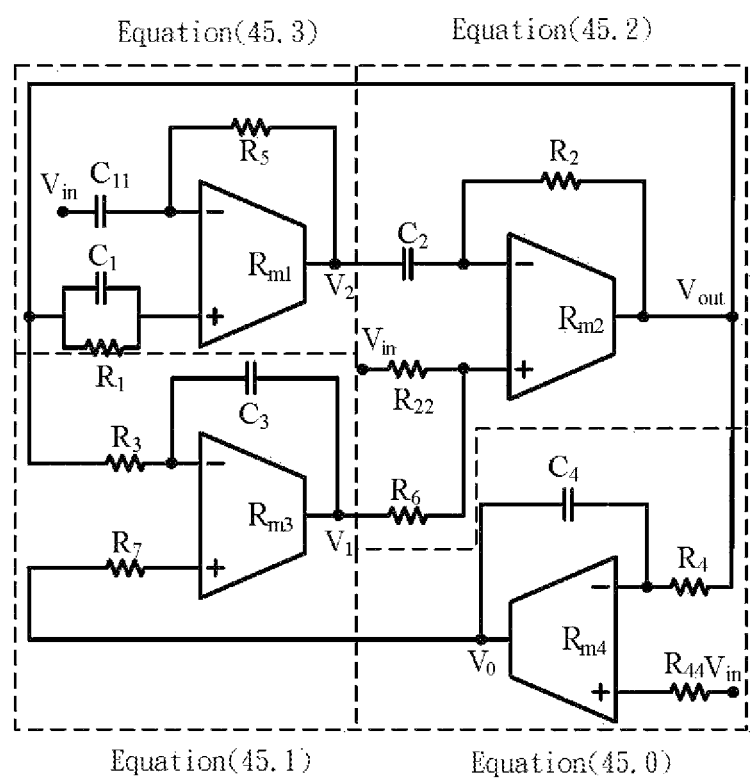
FIG. 12 shows a realization for the elliptic OTRA-C based fourth-order Cauer filter according to the embodiment of the invention.

The synthesized sub-circuitries corresponding to (45.0)-(45.3) are shown in the dashed blocks in FIG. 12, the component values being $C_1=C_2=C_3=C_4=1F$. $C_{11}=(b_4/a_4)F$, $G_1=(a_3/a4)$ ℧, $G_2=(a_2/a_4)$℧, $G_3=(a_1/a_4)$ ℧, $G_4=(a_0/a_4)$ ℧, $G_5=G_6=G_7=1$ ℧, $G_{22}=(b_2/a_4)$ ℧, and $G_{44}=(b_0/a_4)$ ℧.

Embodiment 5

Consider again the elliptic Cauer even-nth-order filter given by (41). Cross-multiplying (41), then dividing both sides of the resulting equation by $a_n s^n$ and rearranging it, we can show that $$V_{out} - \left(\frac{b_n}{a_n}\right)V_{in} = \frac{1}{s}\left(-\frac{a_{n-1}}{a_n}\right)V_{out} + \frac{1}{s^2}\left(\frac{b_{n-3}}{a_n}V_{in} - \frac{a_{n-3}}{a_n}V_{out}\right) + \frac{1}{s^3}\left(-\frac{a_{n-3}}{a_n}\right)V_{out} + \frac{1}{s^4}\left(\frac{b_{n-4}}{a_n}V_{in} - \frac{a_{n-4}}{a_n}V_{out}\right) + \ldots + \frac{1}{s^{n-1}}\left(-\frac{a_1}{a_n}\right)V_{out} + \frac{1}{s^n}\left(\frac{b_0}{a_n}V_{in} - \frac{a_0}{a_n}V_{out}\right) \quad (46)$$

The above equation may be re-written as $$V_{out} - \left(\frac{b_n}{a_n}\right)V_{in} = \quad (47)$$

$$\left(\frac{1}{s}\right)\left(-\frac{a_{n-1}}{a_n}V_{out} + \left(\frac{1}{s}\right)\left(\frac{b_{n-2}}{a_n}V_{in} - \frac{a_{n-2}}{a_n}V_{out} + \left(\frac{1}{s}\right)\left(-\frac{a_{n-3}}{a_n}V_{out} + \ldots + \left(\frac{1}{s}\right)\left(-\frac{a_1}{a_n}V_{out} + \left(\frac{1}{s}\right)\left(\frac{b_0}{a_n}V_{in} - \frac{a_0}{a_n}V_{out}\right)\right)\ldots\right)\right)\right)$$

Based on (47), we may write the following relations.

$$V_0 = \left(\frac{1}{s}\right)\left(\frac{b_0}{a_n}V_{in} - \frac{a_0}{a_n}V_{out}\right) \quad (48.0)$$

$$V_j = \left(\frac{1}{s}\right)\left(V_{j-1} - \frac{a_j}{a_n}V_{out}\right) \quad \text{for } j = 1, 3, 5, \ldots, n-1 \quad (48.j)$$

$$V_k = \left(\frac{1}{s}\right)\left(V_{k-1} + \frac{b_k}{a_n}V_{in} - \frac{a_k}{a_n}V_{out}\right) \text{for } k = 2, 4, 6, \ldots, n-2 \quad (48.k)$$

and $$V_{out} - \left(\frac{b_n}{a_n}\right)V_{in} = V_{n-1} \quad (48.n)$$

Figure 13:
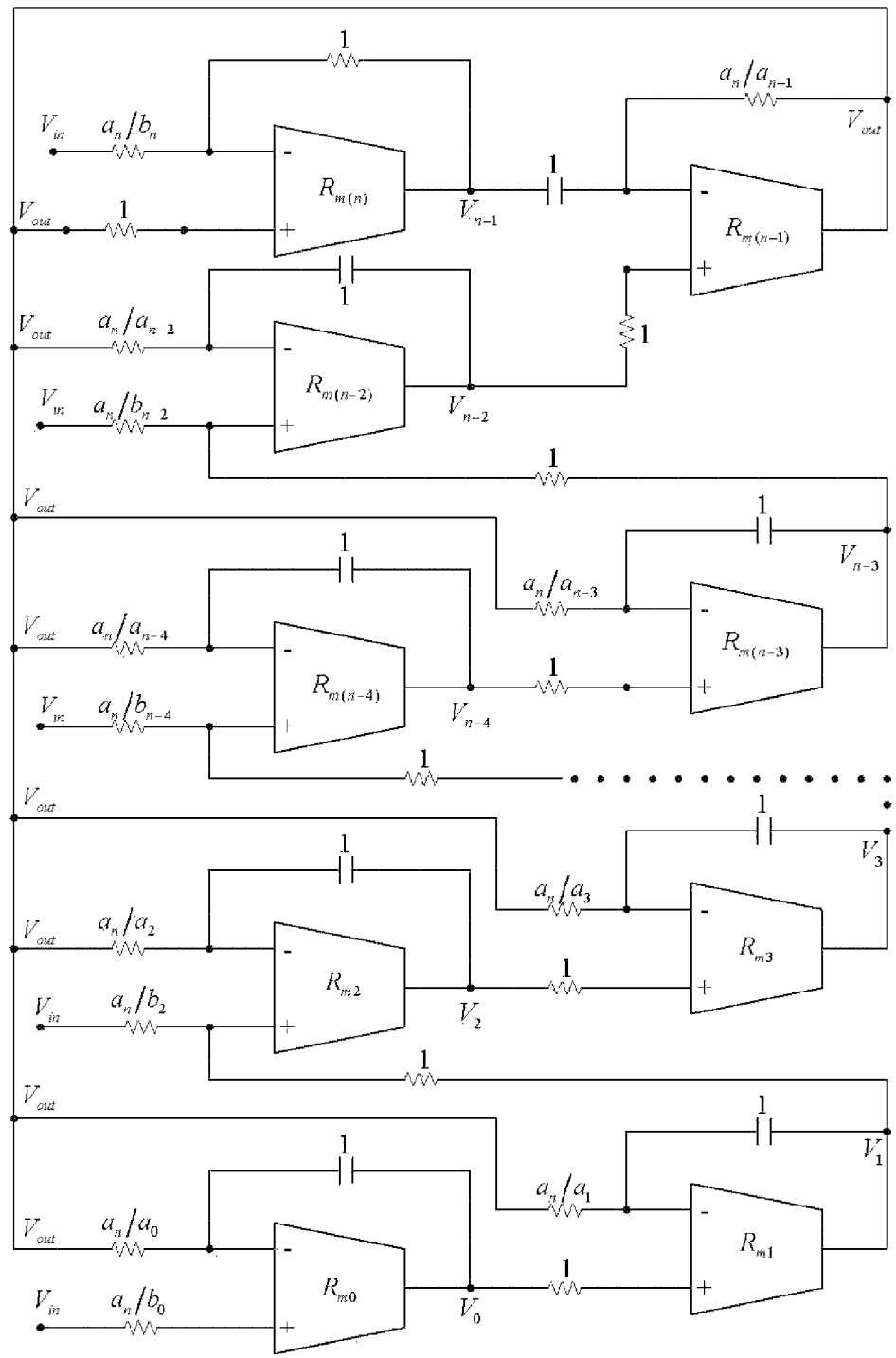
FIG. 13 shows an Elliptic OTRA-C based even-nth-order Cauer Filter structure according to one embodiment of the invention.

Therefore, the transfer function (41) has been decomposed, using a series of algebraic manipulations, into the above n+1 simple equations, from (48.0) to (48.n). Each of these n+1 equations can be realized using a single OTRA, one capacitor and several resistors, except for (48.n) which needs no capacitor. The combination of all the n+1 sub-circuitries realized from (48.0) to (48.n) is shown in FIG. 13, which is a second OTRA-RC structure realizing the even-nth-order elliptic Cauer filter given by (41). There are n+1 OTRAs, n capacitors, and (5n−2)/2 resistors employed in the realization.

Let us again consider the case when n=4; based upon the relations (48), we obtain the following three simple relations.

$$V_0 = \left(\frac{1}{s}\right)\left(\frac{b_0}{a_4}V_{in} - \frac{a_0}{a_4}V_{out}\right) \quad (49.0)$$

$$V_1 = \left(\frac{1}{s}\right)\left(V_0 - \frac{a_1}{a_4}V_{out}\right) \quad (49.1)$$

$$V_2 = \left(\frac{1}{s}\right)\left(V_1 + \frac{b_2}{a_4}V_{in} - \frac{a_2}{a_4}V_{out}\right) \quad (49.2)$$

$$V_3 = \left(\frac{1}{s}\right)\left(V_2 - \frac{a_3}{a_4}V_{out}\right) \quad (49.3)$$

and $$V_{out} - \left(\frac{b_4}{a_4}\right)V_{in} = V_3 \quad (49.4)$$

Figure 14:
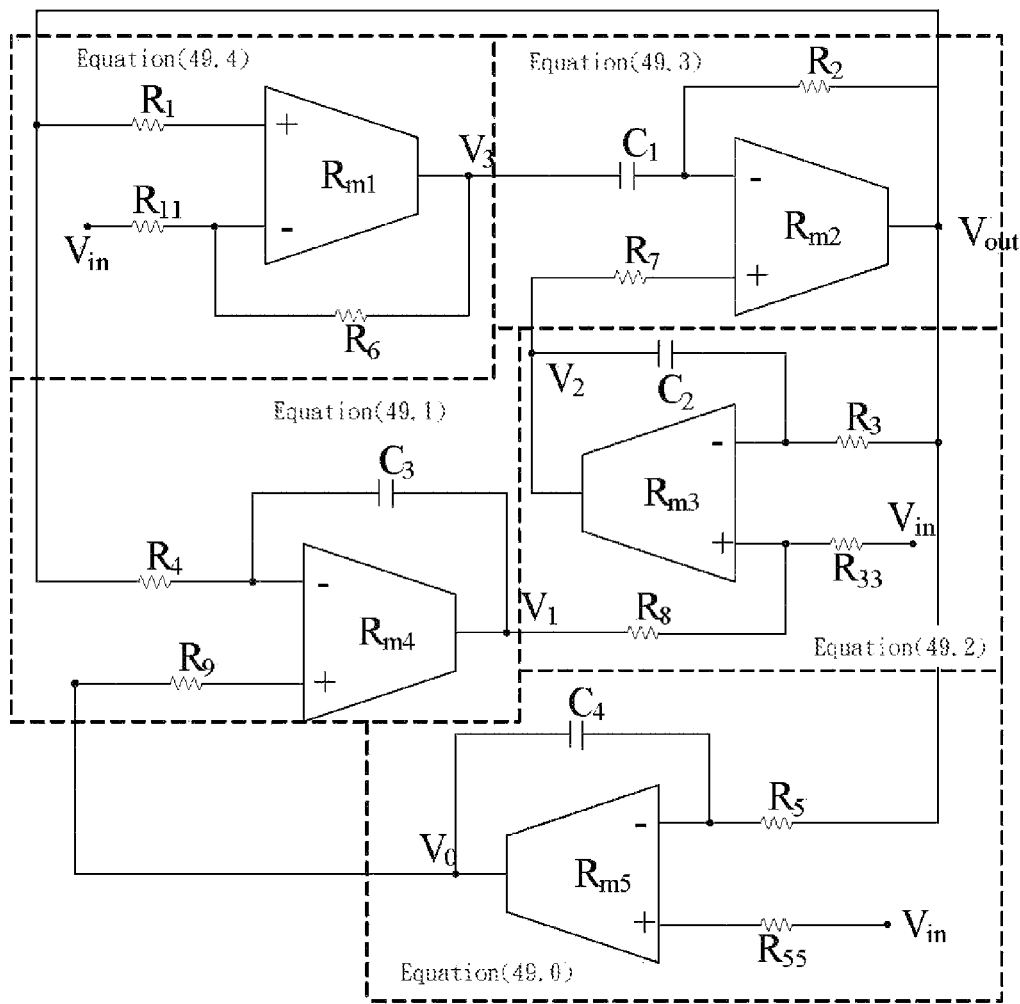
FIG. 14 shows a realization for the elliptic OTRA-C based fourth-order Cauer filter according to the embodiment of the invention.

Equations (49.0)-(49.4) may easily be realized as five OTRA-based sub-circuitries shown in the dashed blocks in FIG. 14, the component values being, $C_1=C_2=C_3=C=1$ F, $G_1=1$ ℧, $G_2=a_3/a_4$ ℧, $G_4=a_1/a_4$ ℧, $G_3=a_2/a_4$ ℧, $G_5=a_0/a_4$ ℧, $G_6=1$ ℧, $G_7=1$ ℧, $G_8=1$ ℧, $G_9=1$ ℧, $G_{11}=b_4/a_4$ ℧, $G_{33}=b_2/a_4$ ℧, and $G_{55}=b_0/a_4$ ℧. Note that all the four capacitors have the same value.

Note that the structure illustrated in embodiment 5 differs from the structure illustrated in embodiment 4. The even-nth-order elliptic Cauer filter of FIG. 11 uses n OTRAs and n+1 capacitors, whereas that of FIG. 13 employs n+1 OTRAs and n capacitors. From the point of view of the area of an integrated circuit, a capacitor in general has a much larger area than an OTRA with fourteen MOSFETs. The fourth-order filter of FIG. 12 is larger in IC area than the one of FIG. 14.

Figure 15:
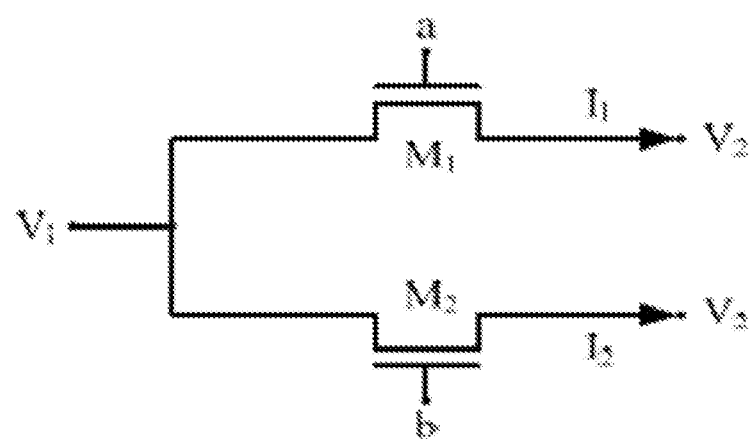
FIG. 15 shows a Non-linearity cancellation in two matched-NMOS transistor circuit.

Since the two input terminals of an OTRA are virtually grounded, the resistor shown in FIGS. 1 to 14 may be replaced by two parallel NMOS transistors M1 and M2, as shown in FIG. 15, both of which are matched and operating in ohmic region. The current passing through an NMOS transistor is given by $$I = K_N(V_G - V_T)(V_D - V_S) + \sum_{i=1}^{2} a_i(V_D'^i - V_S'^i) \quad (53)$$

The transistors M1 and M2 have the same drain and source voltages leading to the cancellation of the odd and even non-linearities. The current difference shown in FIG. 15 is $$I_1 - I_2 = G(V_1 - V_2) \quad (54)$$

where $$G = \mu_N C_{ox} \frac{W}{L}(V_a - V_b) \quad (55)$$

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An analytical synthesis method (ASM) for designing an higher-order voltage-mode elliptic operational trans-resistance amplifier and capacitor (OTRA-C) based filter, comprising:
    using a processor to perform the steps of:
    converting a decomposition of a complicated nth-order transfer function into a set of equations corresponding to a set of sub-circuitries; and
    constructing a circuit structure by combining said sub-circuitries,
    wherein the elliptic OTRA-C based filter comprises n OTRAs and n+1 capacitors to serve as an odd nth order voltage-mode elliptic OTRA-C based universal filter.

2. The ASM for designing an elliptic OTRA-C based filter according to claim 1, wherein the elliptic OTRA-C based filter comprises n sub-circuitries and n is an odd number, and wherein each of the kth sub-circuitries, k=2, 4, . . . , n−1, comprises an OTRA having an negative input, an positive input and an output, and the output is connected to the negative input through a resistor, and the negative input is connected to a voltage input terminal through a resistor, and the positive input is simultaneously connected to a voltage output terminal through a resistor and connected to an output of the OTRA of the k+1th sub-circuitry through a capacitor.

3. The ASM for designing an elliptic OTRA-C based filter according to claim 2, wherein each of the jth sub-circuitries, j=3, . . . , n−2, comprises an OTRA having an negative input, an positive input and an output, and the output is connected to the negative input through a resistor, and the positive input is simultaneously connected to the voltage output terminal through a resistor and connected to the output of the OTRA of the j+1th sub-circuitry through a capacitor.

4. The ASM for designing an elliptic OTRA-C based filter according to claim 3, wherein the nth sub-circuitry comprises an OTRA having an negative input, an positive input and an output, and the output is connected to the negative input through a resistor, and the negative input is connected to the voltage input terminal through a capacitor, and the positive input is connected to the voltage output terminal through a resistor and a capacitor connected in parallel.

5. The ASM for designing an elliptic OTRA-C based filter according to claim 3, wherein the 1th sub-circuitry comprises an OTRA having an negative input, an positive input and an output, and the output is connected to the negative input through a resistor, and the positive input is grounded, and the negative input is connected to the output of the OTRA of the 2th sub-circuitry through a capacitor.

6. The ASM for designing an elliptic OTRA-C based filter according to claim 1, wherein the elliptic OTRA-C based filter comprises n sub-circuitries and n is an odd number, and wherein each of the kth sub-circuitries, k=2, 4, . . . , n−1, comprises an OTRA having an negative input, an positive input and an output, and the output is connected to the negative input through a capacitor, and the negative input is connected to a voltage output terminal through a resistor, and the positive input is simultaneously connected to a voltage input terminal through a resistor and connected to an output of the OTRA of the k−1th sub-circuitry through a resistor.

7. The ASM for designing an elliptic OTRA-C based filter according to claim 6, wherein each of the jth sub-circuitries, j=3, . . . , n−2, comprises an OTRA having an negative input, an positive input and an output, and the output is connected to the negative input through a capacitor, and the negative input is connected to the voltage output terminal through a resistor, and the positive input is connected to the output of the OTRA of the j−1th sub-circuitry through a resistor.

8. The ASM for designing an elliptic OTRA-C based filter according to claim 7, wherein the nth sub-circuitry comprises an OTRA having an negative input, an positive input and an output, and the output is connected to the negative input through a resistor and a capacitor connected in parallel, and the positive input is simultaneously connected to the voltage input terminal through a capacitor and connected to the output of the OTRA of the n−1th sub-circuitry through a resistor.

9. The ASM for designing an elliptic OTRA-C based filter according to claim 7, wherein the 1th sub-circuitry comprises an OTRA having an negative input, an positive input and an output, and the output is connected to the negative input through a capacitor, and the positive input is grounded, and the negative input is connected to the voltage output terminal through a resistor.

* * * * *